(12) United States Patent
Rice

(10) Patent No.: US 6,424,215 B1
(45) Date of Patent: Jul. 23, 2002

(54) HIGH EFFICIENCY CLOSED LOOP FEED FORWARD AMPLIFIER

(75) Inventor: Christopher W Rice, Morris, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/834,088

(22) Filed: Apr. 12, 2001

(51) Int. Cl.[7] ............................................. H03F 1/00
(52) U.S. Cl. ..................................... 330/151; 330/52
(58) Field of Search ................................ 330/107, 136, 330/149, 151, 52

(56) References Cited

U.S. PATENT DOCUMENTS 5,528,196 A * 6/1996 Baskin et al. ............... 330/151
5,623,227 A * 4/1997 Everline et al. ............. 330/151
5,831,478 A * 11/1998 Long ........................... 330/151
6,104,241 A * 8/2000 Cova et al. .................. 330/149
6,111,462 A * 8/2000 Macenicks et al. ......... 330/149

* cited by examiner

*Primary Examiner*—Robert Pascal
*Assistant Examiner*—Khanh Van Nguyen

(57) ABSTRACT

High efficiency and high power output are attained in a multi-tone FF RF amplifier by eliminating fundamentals in a first loop and then operating on the IMD products only in a second loop. Since lower power tones are adjusted in the IMD product reduction, less complex, lower power processing circuitry is required and higher efficiency is realized since both amplifiers add in-phase and approximately equally at the RF output.

9 Claims, 2 Drawing Sheets

HIGH EFFICIENCY CLOSED LOOP FEED FORWARD AMPLIFIER

FIELD OF THE INVENTION

This invention relates to feed forward amplifiers for achieving low distortion during signal amplification and in particular to high efficiency feed forward RF amplifiers. It particularly concerns a feed forward amplifier having a closed loop control of the amplifier to counteract time and temperature variations. It specifically involves RF (radio frequency) amplifiers used in wireless applications. Multi-tone DMT (discrete multi-tone) feed forward RF amplifiers are particularly amenable to the feed forward process described.

BACKGROUND OF THE INVENTION

Feed Forward (FF) amplifiers are special amplifiers that include circuitry for reducing distortion (i.e., in DMT RF amplifiers, intermodulation distortion is caused by the beating of the multi-tone signals together) normally introduced by the amplification process. They (FF amplifiers) are widely used in applications where reduction of signal distortion is critical to achieving performance objectives related to amplified signal clarity. Reduction of distortion is accomplished by use of correction or canceling signals, which are derived from the very signal components causing the distortion and then summed with the amplified signal.

FF RF (i.e., low distortion) amplifiers are very valuable in amplifying multi-tone signals such as are used in high frequency radio signals. Typically, such FF RF amplifiers have two substantially parallel signal processing/amplification paths. A first path (i.e., the amplification path) amplifies the multi-tone signal and in doing so creates inter-modulation distortions (IMD) in the resultant amplified signal. A portion of the multi-tone input signal is separated from the primary amplification path and channeled into a secondary path (i.e., the feed forward path) and combined with the signal as amplified in the first path including the IMD. In the signal combining the IMD signal is amplified to equal the IMD of the amplified signal in the first path. These IMD signals are subtracted from the amplified signal to recover a substantially distortionless amplified multi-tone signal.

While following these generalized principals, practical FF RF amplifiers are considerably more complex in structure and operation. This complexity is needed in part because of the high frequency operation at RF, which accentuates the IMD products. This complexity often takes the form of added control loops or/and added signal processing circuitry. This complexity however often compromises the basic purpose of the FF RF amplifier by introducing inefficiencies, which reduce its overall amplification capability. Hence, it is important to maintain amplification capability as well as reduce IMD.

One example of a widely used FF RF amplifier is described in U.S. Pat. No. 5,917,375 issued to Lisco et al Jun. 29, 1995. This particular FF RF amplifier uses a correction amplifier in a feed forward loop to amplify the signal (i.e., increase output power) as well as providing the IMD cancellation signal to reduce distortion.

Another FF RF amplifier is disclosed in the U.S. Pat. No. 6,111,462, issued to Mucenieks et al on Aug. 29, 2000, uses predistortion in the feed forward path to include the same RF carrier component as that in the amplification path. The amplified signals in both paths are combined (i.e., summed) to produce a high power amplified signal without the IMD components. The circuitry however is complex and power consuming causing inefficiencies. In particular, Quadrature detectors are a required component of the distortion correction circuitry.

SUMMARY OF THE INVENTION

High efficiency and high power output are attained in a multi-tone FF RF amplifier by eliminating fundamentals in a first loop and then operating on the IMD products only in a second loop. Since lower power tones are adjusted in the IMD product reduction, less complex, lower power processing circuitry is required and higher efficiency and lower costs are realized.

In an exemplary embodiment a multi-tone high frequency signal is applied to a first main amplification path, which amplifies a multi-tone high frequency input signal. In the process of amplification, by the first main amplification path, IMD is introduced into the amplified signal.

Input to the main amplification path is sensed at the input and channeled into a secondary amplification path (i.e., sometimes known as a feed forward path), which initially delays the multi-tone high frequency signal. This delayed multi-tone signal is combined with a feedback version of the amplified signal of the main amplification path output to add the distortion tones and permit further phase and amplitude adjustment. Phase adjustment is designed to invert the IMD and align the inverted IMD of the first loop path such that the IMD is out-of-phase with the IMD in the secondary path and combines this IMD in the secondary path through a coupler. This secondary amplification path signal combining the IMD and the multi-tone input is amplified so that the inverted distortion terms are equal in absolute value as to the distortion terms of the main amplification path output. With judicious amplitude, and signal delay distortion products (IMD) are canceled at the output and the multi-tone signal amplitude is enhanced by addition of the two amplification path outputs. This results in a clean (i.e., distortion free) multi-tone signal and improved amplifier efficiency due to the additive enhancement of the output multi-tone signal.

It is readily apparent that the forgoing feed forward system cancels IMD as well as increasing multi-tone amplitude by adding signal output at both the primary and secondary amplifiers, providing improved amplification efficiency and improved low distortion.

DETAILED DESCRIPTION

Figure 1:
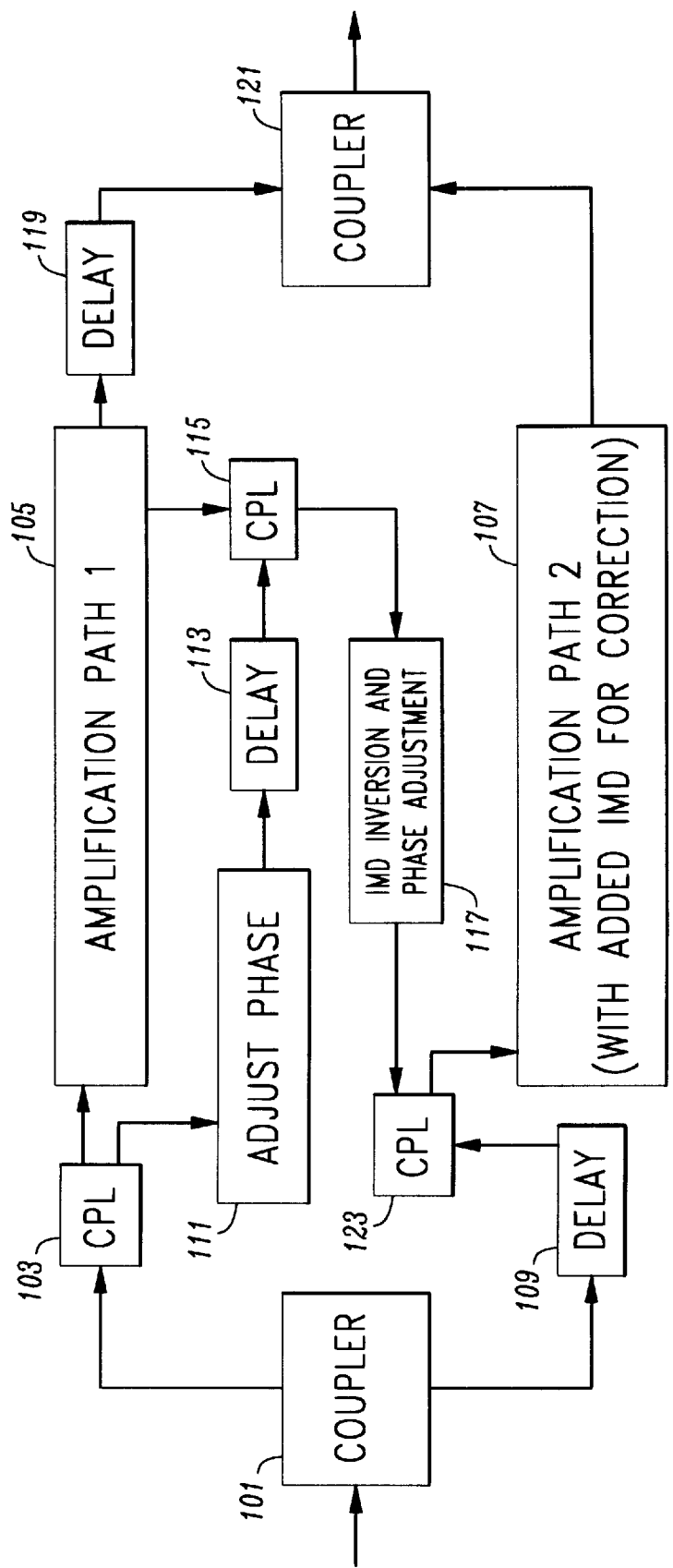
FIG. 1 is a block diagram illustrating principles of the invention.

A feed forward (FF) RF amplifier implementing the principles of the invention that significantly cancels distortion while amplifying the DMT (i.e., multi-tone) input signal. As shown in the functional diagram of FIG. 1 a feed forward amplifier embodying the principles of the invention includes three distinct closed loops. An input high frequency multi-tone signal is applied to input coupler 101 and is coupled to a first amplification path 105 via a coupler 103. Input multi-tones are relayed by coupler 101 to a second amplification path 107 via a delay circuit 109 and coupler 123. A first adjust path 111 couples to the input via coupler 103 and adjusts the phase of the input signal, in phase adjuster 111 by 180° degrees and delays the signal in delay circuit 113 to match corresponding delays in the first amplification path 105.

An output of the first amplification path is coupled to coupler 115, and so is the adjusted and delayed signal output of delay circuit 113. The coupler combines and applies these two signals to the IMD inversion and phase adjustment circuit 117. Circuit 117 applies these signals, just prior to amplification processes, into the second amplification path 107. Phase adjustment and inversion adjusts the delayed input which when combined with the output of the first amplification path has a multi-tone component in phase with the delayed two tone input applied to the second amplification path. IMD distortion components are inverted with respect to the IMD output of the first amplification path. The outputs of the two amplification paths are combined in output coupler 121.

The output of the first amplification path is delayed in delay circuit 119 to correspond to delays introduced into the signal by the second amplification path 107 and is applied to output coupler 121. The two processing loops including amplitude and phase adjustment circuits of 111 and 117 accomplish signal adjustments so that the multi-tone signal is increased in amplitude and the IMD is canceled at the output coupler 121.

Figure 2:
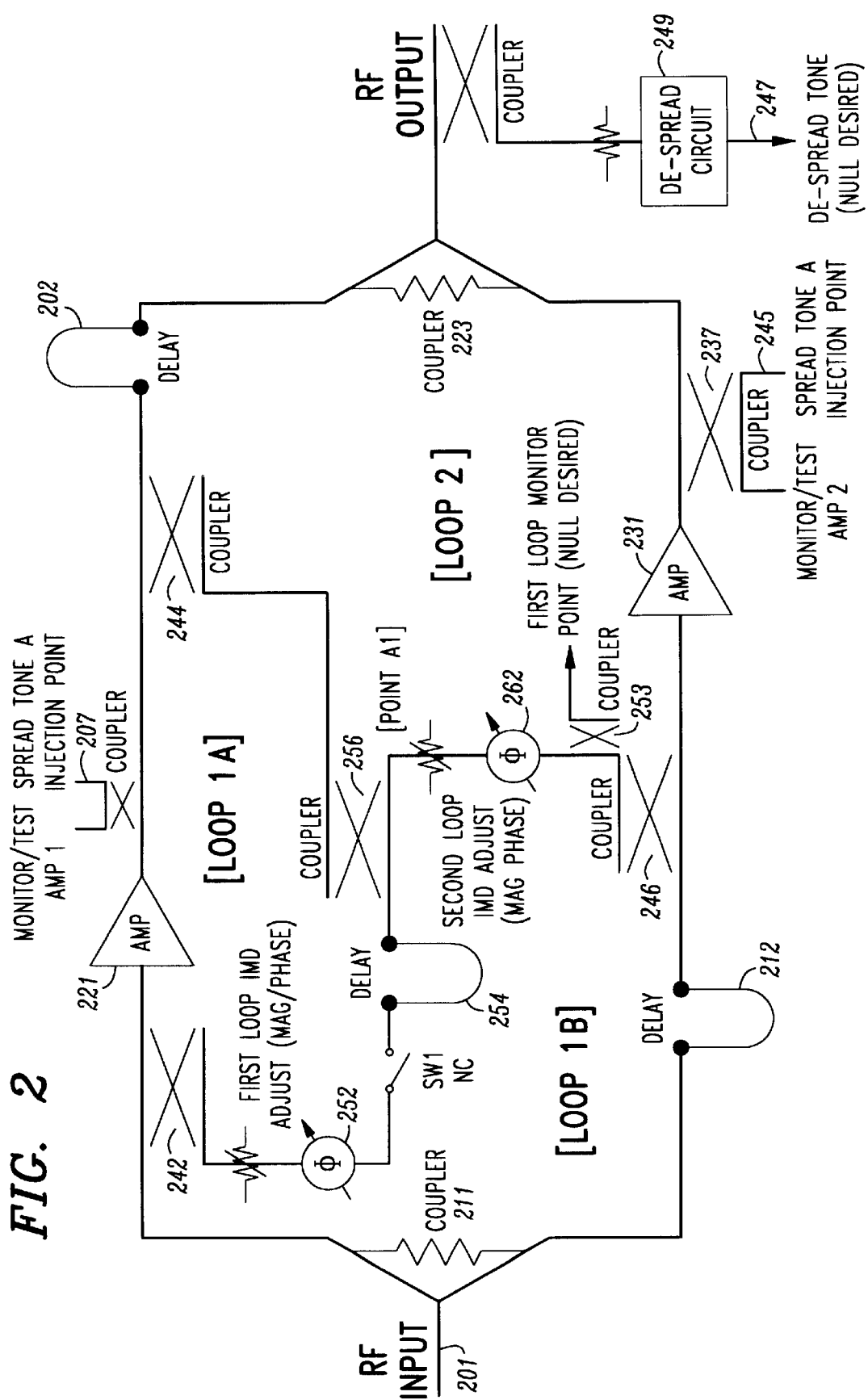
FIG. 2 is a schematic of a feed forward system incorporating the principles of the invention.

The amplification system of FIG. 1 is shown in schematic form in the FIG. 2 in which the controlling loops of the system are shown as well as the circuit components. The system is configured so that the main terms in the first and second amplification paths are of equal phase and are additive to increase and maximize RF power output. The IMD terms are of opposite phase so that they completely cancel.

A high frequency multi-tone RF signal is applied to the input 201 of the coupler 211 and is divided into two signal amplification paths. Each amplification path includes an identical RF multi-tone amplifier 221 and 231 respectively. Amplifier 221 receives the multi-tone RF and amplifies it and in the process generates signal distortions (i.e., IMD). This signal is applied, via delay circuit 202, to an output coupler 223 where it is combined with a processed RF signal from the second amplification path that enhances the multi-tone RF signal and cancels the IMD.

Amplifier 231 receives an input from the coupler 211, which has been delayed by delay circuit 212. A distortion correcting input is also applied to the input of amplifier 231. A distortion cancellation circuit (described below) supplies this correcting input.

Input to distortion control circuitry is derived from multiple control points of the circuitry. A sensing coupler 242, connected at the input to amplifier 221, applies a signal representative of the multi-tone input to a first loop IMD adjuster device 252 that controls a magnitude and phase of the sensed signal. This adjusted signal is applied to a delay circuit 254 to compensate for delays occurring in the amplifier 221. This path may be disconnected by opening a normally closed switch 247 if adding the RF input to the signal processing of the loop is not desired.

This adjusted signal is combined with a signal sensed by sensing coupler 244 at the output of amplifier 221. The multi-tone signal plus IMD terms from coupler 244 are combined with the multi-tone signal from delay element 254 in coupling device 256 such that the multi-tone signals cancel, leaving only IMD at the output of coupler 256. The amplitude and phase adjustment circuit from device 262 operates to invert the distortion terms sensed from the output of amplifier 221. This modified signal is applied to the input of the amplifier 231 via coupler 246. At this point, the input signal to amplifier 231 comprises a multi-tone RF signal accompanied by an inverted multi-one distortion signal. The inverted IMD of the input signal counteracts the IMD introduced by amplifier 231 (i.e., amplifiers 221 and 231 are identical).

The output of amplifier 231 is an amplified multi-tone RF signal with an accompanying inverted multi-tone distortion signal. When this signal is combined with the output of amplifier 221 as delayed by delay circuit 202 the distortion terms cancel and the multi-tone signals are additive. Hence, the overall result is a distortion less multi-tone RF signal output at very high efficiency due to the additive effects from both amplifiers, 221 and 231.

It is readily apparent that the various delays must be selected so that the multi-tone RF signals and multi-tone distortion terms are in exact phase alignment whereby the various summing and inversions may properly cancel the distortion terms and enhance the amplitude of the dial tone RF signal. Variable attenuators subject to control signals and variable phase shifting circuits subject to control signals may accomplish amplitude and phase adjustment.

A signal sensing point is provided at the node 253 to monitor the signal level applied the second RF amplifier. Adjustment of the signal component to a minimum at this point assures that the distortion circuitry is operating properly.

As shown in the FIG. 2 schematic, the FF RF amplifier includes inputs for injecting spreading signals into the amplification process. A spreading tone injection point 207 accepts a spreading tone just prior to the feedback coupler 244. This injected spreading tone provides a mechanism to ensure that the adjustment of circuitry 262 provides proper IMD cancellation. A spreading tone is also injected into the output of the amplifier 231 at injection point 245. Despreading of the spread tones is performed at the output at detection point 247 by a despreading circuit 249. By nulling the spread tone signals at the output of despreading circuit 249, the nulling of the distortion products is assisted. Spreading tones are provided by an oscillation system so that spreading tones provided at points 207 and 237 are synchronized with each other as well as the despreading circuit 249.

While a specific embodiment of the invention has been disclosed, it is understood that those skilled in the art thereof may devise variations without departing from the spirit and scope of the invention.

What is claimed is:

1. A feedforward (FF) RF amplifier comprising:

a RF signal input and a RF signal output;

a first amplification path including a first RF amplifier and a second amplification path including a second RF amplifier; the first and second RF amplifiers being substantially identical;

the first and second amplification path each disposed between the RF signal input and the RF signal output and each amplification path adding directly to the RF signal output;

an intermodulation distortion (IMD) adjusting path disposed between an input to the first RF amplifier and an input to the second RF amplifier; including first and second IMD adjusting circuitry;

a signal coupling path coupling an output of the first RF amplifier to a node of the IMD adjusting path located intermediate the first and second IMD adjusting circuitry; the signal coupling path providing the IMD for processing by the second IMD adjusting circuitry;

the combined effect of the IMD adjusting path and signal coupling path providing inverted distortion terms at an input to the second RF amplifier; and circuit delays for adjusting the signals in the first and second amplification paths and the IMD adjusting path so that the multi-tones are maintained in alignment at an input to the first RF amplifier and at an input to the second RF amplifier and at the RF signal output and input nodes for applying spreading codes to outputs of the first and second RF amplifiers; and despreading circuitry connected to the RF signal output for minimizing a despread tone output.

2. The FF RF amplifier of claim 1, comprising:

the circuit delays including a first delay in the first amplification path including a first delay device located at the output of the first RF amplifier; a delay in the second amplification path including a second delay device located at an input of the second RF amplifier and a third delay in the IMD adjusting path including a third delay device located intermediate the first and second IMD adjusting circuitry.

3. The FF RF amplifier of claim 1, comprising:

the IMD adjusting circuitry including a signal attenuator and a phase adjuster.

4. The FF RF amplifier of claim 1, comprising:

the RF signal input comprising a signal coupler dividing an RF signal input into two paths connected to the first and second amplification paths respectively; and the RF signal output comprising a signal coupler combining RF signal outputs of the first and second amplification paths into a single RF output signal.

5. A method of amplifying an input RF signal and providing a substantially distortion less RF output signal comprising the steps of:

amplifying the input RF signal in a first RF amplifier;

delaying the input RF signal for a first duration and amplifying the delayed RF signal in a second RF amplifier;

sensing the input RF signal applied to the first RF amplifier and delaying the sensed RF signal for a second duration and combining it with a sensed output of the first RF amplifier and processing to invert distortion tones (IMD);

applying the inverted distortion tones (IMD) to an input of the second RF amplifier;

delaying the output of the first RF amplifier for a third duration and combining the delayed output of the first RF amplifier with an output of the second RF amplifier, simultaneously canceling IMD and constructively, and approximately equally, and adding the desired multi-tone signals from both amplifiers;

whereby the first delay has a duration equal to a phase inversion of the RF signal input, the second delay has a duration equal to the inherent delay of the first amplifier and the third delay has a duration sufficient to match a phase of the output of the second RF amplifier;

applying spreading code to outputs of the first and second RF amplifiers; and despreading at the RF output and minimizing the spreading tones.

6. The method of claim 5 comprising the step of:

sensing and minimizing the multitone component of the signal at the coupling of the input to the second RF amplifier.

7. A feed forward amplifier system comprising:

a RF input and a RF output;

the RF input comprises a signal coupler dividing an RF signal input into first and second RF transmission paths;

first and second RF amplifiers inserted into the first and second RF transmission paths interconnecting said RF input and said RF output;

signal adjustment and inversion circuitry, connected between the first and second RF transmission paths, including a transmission path coupling an input of the first RF amplifier to an input of the second RF amplifier, and operative for separating intermodulation distortion (IMD) products from an RF signal in the first transmission path;

the inversion circuitry connected for inverting the separated IMD products and coupling the separated IMD products to an input of the second RF amplifier by a transmission path interconnecting an output of the first RF amplifier to an input of the second RF amplifier; and delay circuitry for maintaining alignment between RF signals in the first and second transmission paths;

the RF signal output comprises a signal combiner combining RF signal output of the first and second RF transmission paths into a single RF output signal; and a first input at an output of the first RF amplifier for accepting a spreading tone;

a second input at an output of the second RF amplifier for accepting a spreading tone; and a node at the RF signal output for accepting a de-spread circuit;

whereby IMD products are canceled and RF signal fundamentals are added.

8. A feed forward amplifier system as claimed in claim 7, further comprising:

a signal sensing point connected to an input of the second RF amplifier to permit adjusting of signal components to a minimum at this junction.

9. A feed forward amplifier system as claimed in claim 7, further comprising:

a switch for selectively disconnecting the input of the first RF amplifier from the adjustment and inversion circuitry.

* * * * *

UNITED STATES PATENT AND TRADEMARK OFFICE
CERTIFICATE OF CORRECTION

PATENT NO. : 6,424,215 B1
DATED : July 23, 2002
INVENTOR(S) : Christopher W. Rice It is certified that error appears in the above-identified patent and that said Letters Patent is hereby corrected as shown below:

<u>Title page,</u>
Item [75], should read: -- [75] Inventor: Christopher W. Rice, Parsippany, NJ (US) --

Signed and Sealed this

Twenty-fifth Day of February, 2003

JAMES E. ROGAN
*Director of the United States Patent and Trademark Office*